United States Patent
Nickel et al.

(10) Patent No.: US 6,905,888 B2
(45) Date of Patent: Jun. 14, 2005

(54) MAGNETIC MEMORY ELEMENT HAVING CONTROLLED NUCLEATION SITE IN DATA LAYER

(75) Inventors: Janice H. Nickel, Sunnyvale, CA (US); Manoj Bhattacharyya, Cupertino, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 40 days.

(21) Appl. No.: 10/676,414

(22) Filed: Sep. 30, 2003

(65) Prior Publication Data

US 2004/0062125 A1 Apr. 1, 2004

Related U.S. Application Data

(62) Division of application No. 10/173,195, filed on Jun. 17, 2002.

(51) Int. Cl.[7] .............................................. H01L 21/00
(52) U.S. Cl. ............................................. 438/3; 257/295
(58) Field of Search .............................. 438/3; 257/295

(56) References Cited

U.S. PATENT DOCUMENTS

| | | | |
|---|---|---|---|
| 6,205,051 B1 | 3/2001 | Brug et al. | |
| 6,538,921 B2 * | 3/2003 | Daughton et al. | 365/171 |
| 6,570,783 B1 * | 5/2003 | Deak | 365/158 |
| 6,798,691 B1 * | 9/2004 | Ounadjela et al. | 365/171 |
| 6,803,616 B2 * | 10/2004 | Nickel et al. | 257/295 |

OTHER PUBLICATIONS

McMicheal R D et al: Domain Wall Traps for Low–field Switching of Submicron Elements: Journal of Applied Physics, American Institute of Physics NY, US vol. 87 No. 9 May 1, 2000.

Semet et al: Field Electron Emission from Indvidiual Carbon Nanotubes fo a Vertically Aligned Array. Applied Physics letter vol. 80, No. 2 Jul. 8, 2002 pp. 343–345.

\* cited by examiner

*Primary Examiner*—Christian Wilson

(57) ABSTRACT

A ferromagnetic data layer of a magnetic memory element is formed with a controlled nucleation site. In some embodiments, the nucleation site may be a divot in the data layer or a protrusion from the data layer. A Magnetic Random Access Memory ("MRAM") device may include an array of magnetic memory elements having data layers with controlled nucleation sites.

18 Claims, 4 Drawing Sheets

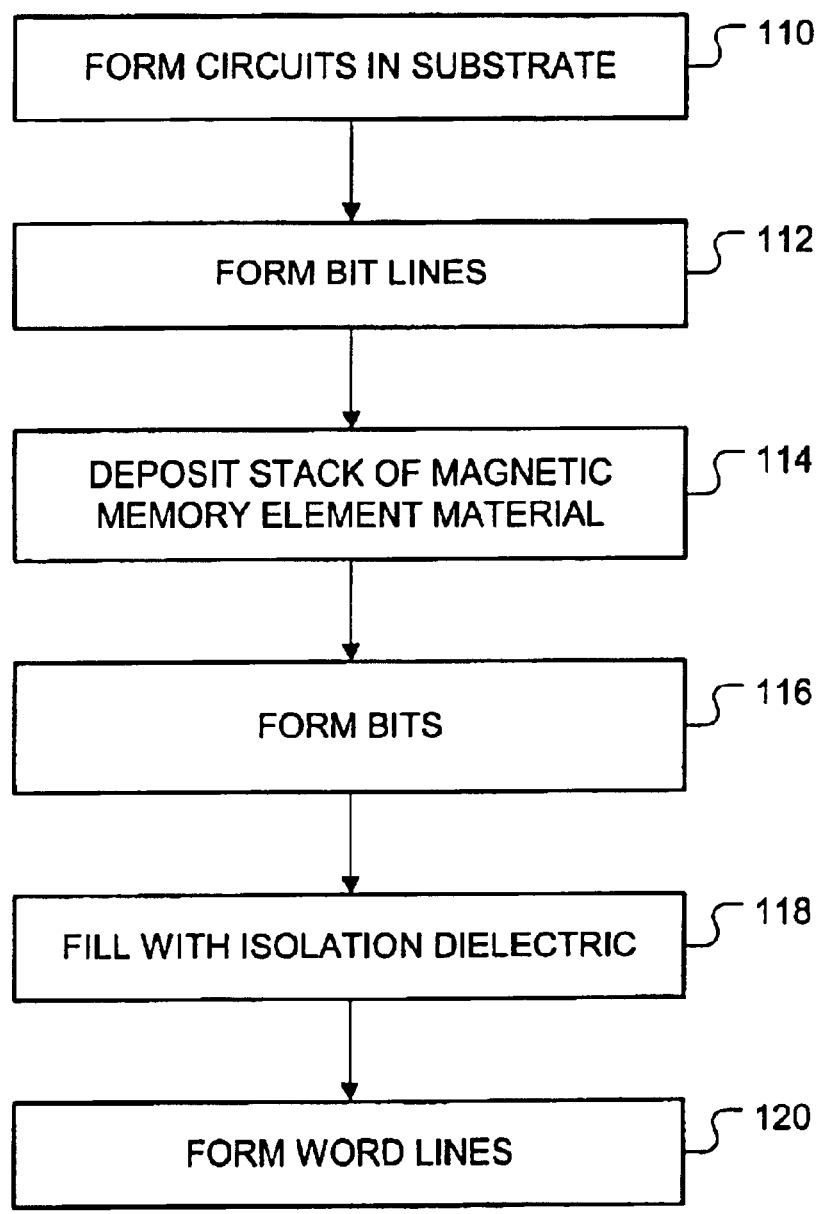

MAGNETIC MEMORY ELEMENT HAVING CONTROLLED NUCLEATION SITE IN DATA LAYER

This is a divisional of U.S. Ser. No. 10/173,195 filed Jun. 17, 2002.

BACKGROUND

Consider the example of a Magnetic Random Access Memory (MRAM) device. The device includes a resistive cross point array of magnetic tunnel junctions. Each magnetic tunnel junction is located at a cross point of a word line and a bit line, and has a magnetization that assumes one of two stable orientations at any given time. These two stable orientations, parallel and anti-parallel, represent logic values of '0' and '1.

A write operation on a "selected" magnetic tunnel junction may be performed by supplying write currents to the word and bit lines crossing the selected magnetic tunnel junction. The write currents create two orthogonal external magnetic fields. The magnetic tunnel junctions are designed to switch (from parallel to anti-parallel or vice versa) only in the presence of the two orthogonal magnetic fields.

A "half-selected" magnetic tunnel junction lies along only one line that is supplied with a write current (either a bit line or a word line). Thus, a half-selected magnetic tunnel junction is exposed to only one external magnetic field during a write operation. The magnetic tunnel junctions are designed not to switch in the presence of a single magnetic field.

In practice, however, switching distributions of the magnetic tunnel junctions in an MRAM array are large, and the switching fields of nominally similar magnetic tunnel junctions are non-uniform. Some half-selected magnetic tunnel junctions switch in the presence of only a single external magnetic field, and some selected magnetic tunnel junctions do not switch in the presence of two orthogonal magnetic fields.

A write error occurs if the magnetization orientation of a selected magnetic tunnel junction is not switched, or if the magnetization orientation of a half-selected magnetic tunnel junction is inadvertently switched. In a large MRAM array, many write errors can place a substantial burden on error code correction.

SUMMARY

According to one aspect of the present invention, a ferromagnetic data layer of a magnetic memory element is formed with a controlled nucleation site. Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 6 is an illustration of a method of fabricating an MRAM device according to an embodiment of the present invention.

DETAILED DESCRIPTION

Figure 1:
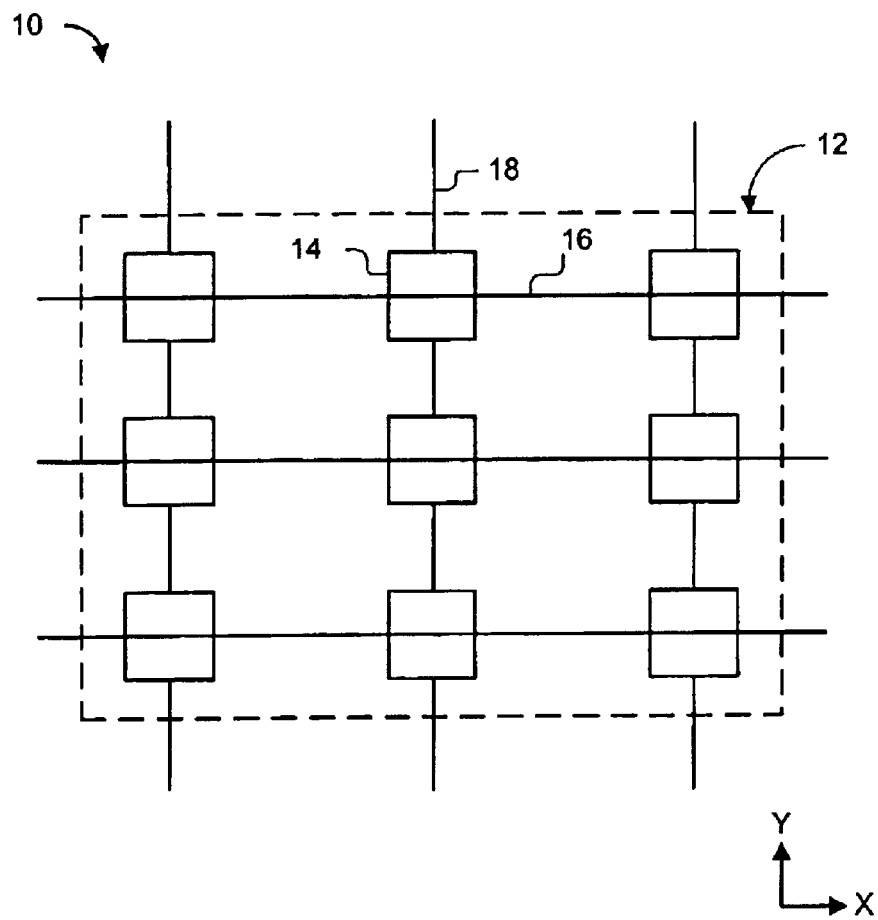
FIG. 1 is an illustration of an MRAM device according to an embodiment of the present invention.

As shown in the drawings for purposes of illustration, the present invention is embodied in an MRAM device including an array of magnetic memory elements. Data layers of the MRAM device have controlled nucleation sites. The controlled nucleation sites improve switching distribution of the magnetic memory elements, which increases reliability of writing to the magnetic memory elements.

Reference is now made to FIG. 1, which illustrates an MRAM device 10 including an array 12 of memory cells 14. The memory cells 14 are arranged in rows and columns, with the rows extending in an x-direction and the columns extending in a y-direction. Only a relatively small number of memory cells 14 are shown to simplify the description of the device 10. In practice, arrays of any size may be used.

Word lines 16 extend in the x-direction of the memory cell array 12, and bit lines 18 extend in the y-direction of the memory cell array 12. There may be one word line 16 for each row of the array 12 and one bit line 18 for each column of the array 12. Each memory cell 14 is located at a cross point of a word line 16 and bit line 18.

The MRAM device 10 also includes a read/write circuit (not shown) for performing read and write operations on the memory cells 14. The read/write circuit senses the resistance states of selected memory cells during read operations. The read/write circuit supplies write currents to selected word and bit lines 16 and 18 during write operations.

Each memory cell 14 includes at least one magnetic memory element. The magnetic memory elements may be magnetic tunnel junctions, giant magneto-resistive (GMR) devices, AMR devices, or any other magnetic memory device in which a data layer is switched. These devices include ferromagnetic data and reference layers separated by a spacer layer. If the magnetic memory element is a GMR device, the spacer layer is made of a conductive material such as copper. If the magnetic memory element is a magnetic tunnel junction, the spacer layer is an insulating tunnel barrier made of a material such as $Al_2O_3$.

Figure 2:
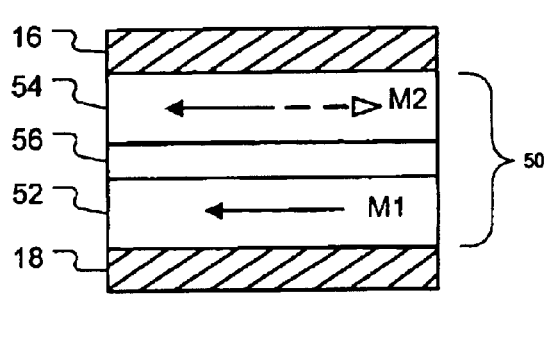
FIG. 2 is an illustration of a magnetic memory element of the MRAM device.

Additional reference is made to FIG. 2, which shows an exemplary magnetic memory element 50. The exemplary magnetic memory element 50 is a magnetic tunnel junction including a pinned layer 52, a data layer 54, and an insulating tunnel barrier 56 between the pinned and data layers 52 and 54. The pinned layer 52 has a magnetization (represented by vector M1) that is oriented in the plane of the pinned layer 52 but fixed so as not to rotate in the presence of an applied magnetic field in a range of interest. The data layer 54 has a magnetization (represented by vector M2) that is not pinned. Rather, the magnetization can be oriented in either of two directions along an axis (the "easy" axis) lying in the plane of the data layer 54 (one direction is shown in solid, and the other direction is shown in dashed). If the magnetization vectors (M1 and M2) of the pinned and data layers 52 and 54 point in the same direction, the orientation of the magnetic tunnel junction is said to be "parallel". If the magnetization of the pinned and data layers 52 and 54 layers point in opposite directions, the orientation of the magnetic tunnel junction is said to be "anti-parallel."

The insulating tunnel barrier 56 allows quantum mechanical tunneling to occur between the data and pinned layers 54 and 52. This tunneling phenomenon is electron spin dependent, making the resistance of the magnetic tunnel junction a function of the relative orientations of the magnetization of the pinned and data layers 52 and 54. The magnetization orientation and, therefore, the stored logic value may be read by sensing the resistance state of the magnetic tunnel junction.

Figure 3:
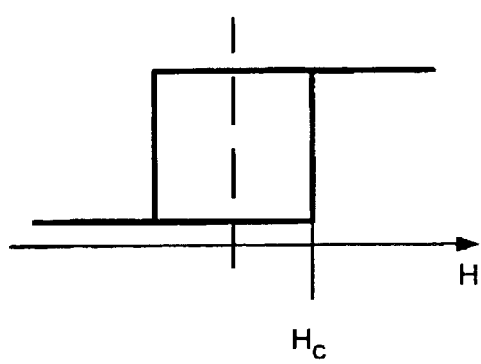
FIG. 3 is an illustration of a hysteresis curve for the magnetic memory element.

The write currents create magnetic fields about the word and bit lines 16 and 18 crossing the selected memory cell. When combined, these two magnetic fields exceed the coercivity of the data layer and cause the magnetization vector (M1) of the data layer 54 to assume a desired orientation. A hysteresis curve for the magnetic tunnel junction is shown in FIG. 3. Coercivity is denoted by Hc. When the combined magnetic field exceeds the coercivity, the magnetic tunnel junction can be switched.

Figure 4:
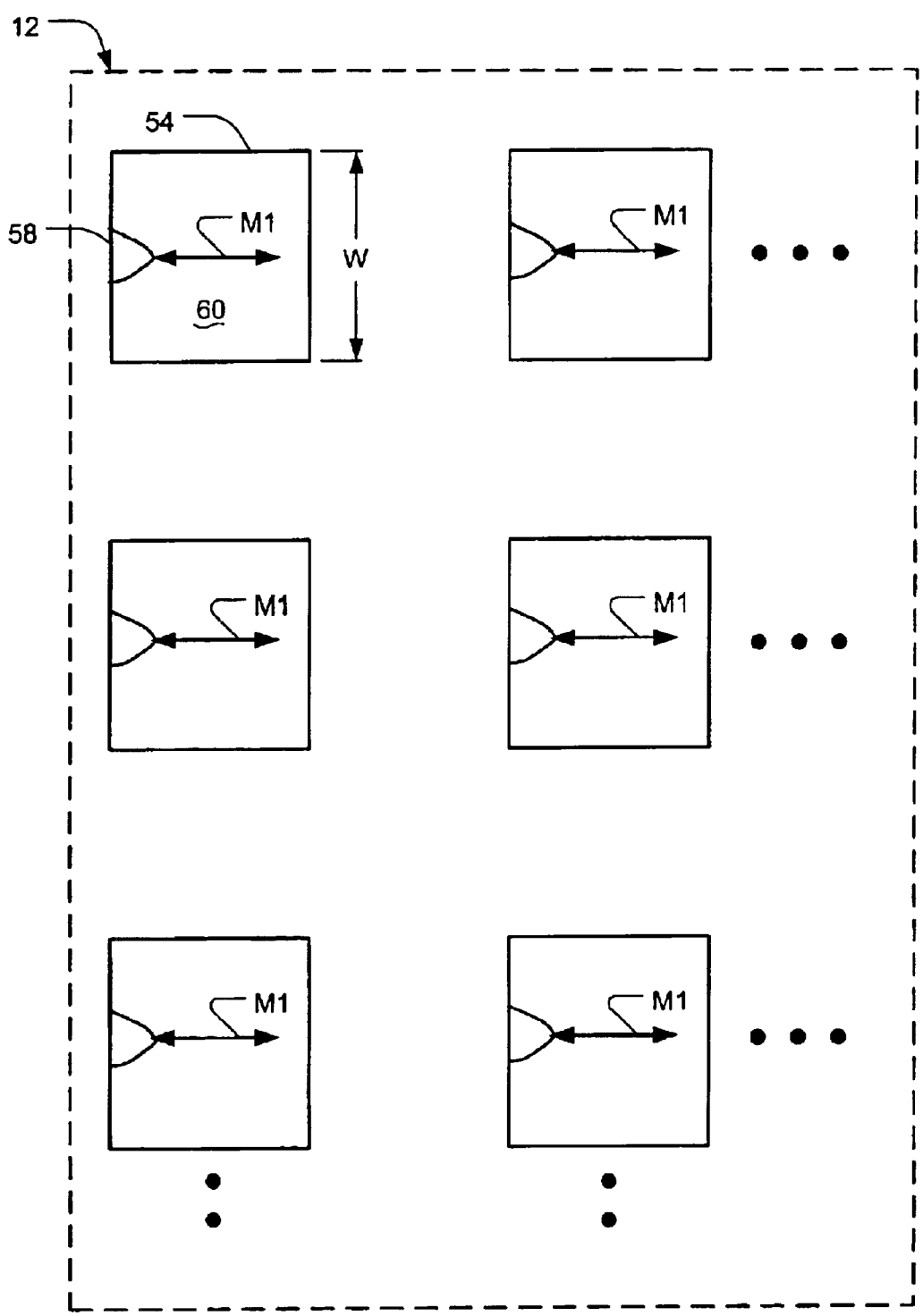
FIG. 4 is an illustration of an array of data layers in the MRAM device.

Reference is now made to FIG. 4, which shows a plurality of data layers 54 in the array 12 of the MRAM device 10. The data layers 54 have controlled nucleation sites 58. The nucleation sites 58 are regions where the reversal of magnetization is initiated. They have a lower switching threshold relative to the neighboring regions 60 of the data layer 54. The nucleation sites 58 are controlled in that they have the same locations in the data layers 54 of all memory cells in the array 12. The locations are preferably along edges of the data layers 54, and more preferably near corners.

Nucleation, the initiation of switching reversal, occurs at the nucleation sites 58. Since a nucleation site 58 is not fully surrounded by the neighboring region 60 of the data layer 54, magnetic exchange interaction between the nucleation site 58 and the neighboring region 60 of the data layer 54 is reduced, and only occurs at the boundary of the neighboring region 60 and the nucleation site 58. As a result, switching reversal always begins at the nucleation site 58, even if the neighboring region 60 contains defects.

If the nucleation sites 58 are formed along the edges on the data layers 54, the randomness of nucleation is reduced. Consequently, switching distribution (the distribution of coercivities) of the memory cells 14 in the device 10 is more uniform.

The nucleation sites 58 may be protrusions from the data layers 54 or divots in the data layers 54. The shape of the divots or protrusions may be circular, elliptical, rectangular, or any other shape.

Size of the nucleation sites 58 may be between 0.25 W and 0.75 W, where W is the width of the data layer 54. However, the size of the nucleation sites 58 is not limited to that range. The size of the nucleation sites 58 may be much smaller than W, for example, in the range of 0.05 W to 0.1 W.

The nucleation sites 58 may be as thick as, or thicker than, the data layer 54. Thus the protrusions may be as thick as the data layer 54, and the divots may extend through the data layer 54.

The size and shape of the nucleation sites 58 across the array 12 may be uniform. Uniform size and shape across the array 12 should improve uniformity of nucleation energy.

Figure 5A:
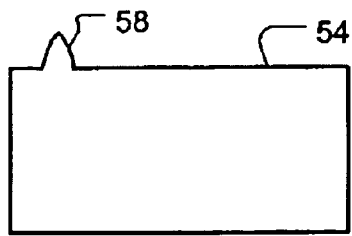
FIGS. 5a–5f are illustrations of data layers having different types and arrangements of controlled nucleation sites.
Figure 5B:
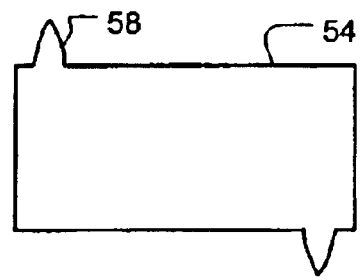
Figure 5C:
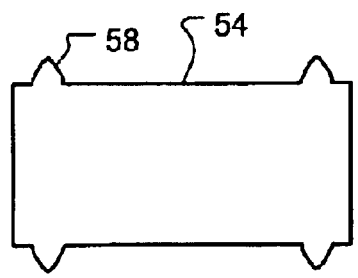
Figure 5D:
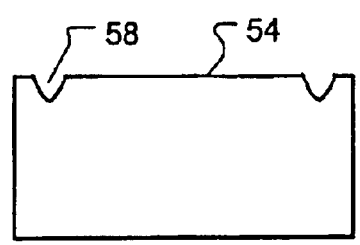
Figure 5E:
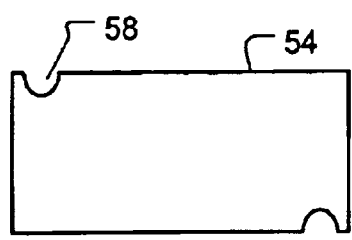
Figure 5F:
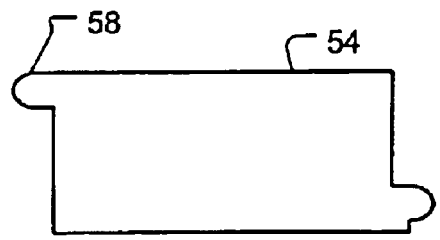

The data layers 54 are not limited to the nucleation sites 58 shown in FIG. 4. Other type and arrangements of nucleation sites are shown in FIGS. 5a–5f. FIGS. 5a, 5b, 5c 5f show that the nucleation sites 58 may be protrusions instead of divots, FIGS. 5b–5f shows that a data layer 54 may have more than one nucleation site 58; and FIGS. 5b, 5e and 5f show that two nucleation sites 58 may be formed at different edges.

In FIGS. 5b–5e the nucleation sites 58 are shown as having a symmetric arrangement on the data layers 54.

However, they are not so limited. For example, FIG. 5f shows the nucleation sites 58 have a non-symmetric arrangement. The non-symmetric arrangement may be used to compensate for an offset in switching fields. For example, one site might nucleate at a higher switching field for one direction, and a lower switching for the other direction. Thus the offset is balanced out du to magnetostatics.

Reference is now made to FIG. 6, which illustrates the fabrication of a first level of an MRAM device. The fabrication will be described in connection with magnetic tunnel junctions.

The read/write circuit and other circuits are formed in a silicon substrate (110). Bit lines are formed on the substrate (112). A stack of magnetic memory element material is deposited (114). A stack for magnetic tunnel junctions may include pinned ferromagnetic layer material, insulating tunnel barrier material, and data layer material. The data layer material may be deposited before or after the pinned layer material.

Bits are formed (116). Lithography (e.g., photolithography, e-beam lithography) may be used to define a pattern on the stack, and bits may be formed by a process such as ion milling, chemical etching, drying etching, etc. The patterns include the definitions of the nucleation sites. Thus the nucleation sites (e.g., protrusions, divots) are formed during formation of the bits.

A hard mask may be used during bit formation to define the bits (including the nucleation sites). An advantage of the hard mask is that it reduces edge roughness and allows the bits to be formed closer together.

Each bit may be milled down to its pinned layer. As a result, a nucleation site may also be formed on each pinned layer, as well as each data layer.

Gaps between the bits are filled in with an isolation dielectric (118). Then bit lines are deposited (120).

Additional levels may be added to the MRAM device. An insulation material such as silicon dioxide is deposited on the last level, and a new level is fabricated by repeating steps 112–120.

The MRAM device may be used in a variety of applications. For example, the MRAM device may be used for long term data storage in devices such as solid state hard drives and digital cameras. It may be used for embedded applications such as extremely fast processors and network appliances.

The present invention is not limited to the specific embodiments described and illustrated above. Instead, the invention is construed according to the claims that follow.

What is claimed is:

1. A method of fabricating a magnetic memory element, the method comprising forming a ferromagnetic data layer with a controlled nucleation site; the nucleation site being a divot in the data layer or a protrusion from the data layer.

2. The method of claim 1, wherein the nucleation site is not surrounded by a neighboring region of the data layer.

3. The method of claim 1, wherein the nucleation site has a lower switching threshold relative to a neighboring region of the data layer.

4. The method of claim 1, wherein the nucleation site is formed at an edge of the data layer.

5. The method of claim 1, wherein the nucleation site is formed at a corner of the data layer.

6. The method of claim 1, wherein the data layer has at least two nucleation sites with a symmetric arrangement.

7. The method of claim 1, further comprising forming additional magnetic tunnel junction layers.

8. A method of fabricating a magnetic memory element, the method comprising forming a ferromagnetic data layer with a non-symmetric arrangement of controlled nucleation sites, the nucleation sites having a uniform size and shape.

9. A method of fabricating a data storage device, the method comprising forming an array of square or rectangular ferromagnetic data layers, each layer having first and second neighboring regions, the first regions having a lower switching threshold than the second regions and a substantially smaller size than the second regions, the first regions at the same location on the data layers across the array.

10. The method of claim 9, wherein the first regions are located at corners of the data layers.

11. The method of claim 9, wherein the first regions are located at edges of the data layers.

12. The method of claim 9, wherein the first regions are either divots in the data layers or protrusion from the data layers.

13. The method of claim 9, wherein each data layer has more than one first region.

14. The method of claim 13, wherein each data layer has a symmetric arrangement of first regions.

15. The method of claim 13, wherein each data layer has a non-symmetric arrangement of first regions.

16. The method of claim 9, wherein the first regions have a uniform size and shape across the array.

17. The method of claim 9, wherein the first regions are formed during bit formation.

18. The method of claim 9, further comprising forming additional magnetic tunnel junction layers.

* * * * *